(12) United States Patent
Kim et al.

(10) Patent No.: US 11,809,650 B2
(45) Date of Patent: Nov. 7, 2023

(54) DISPLAY DEVICE

(71) Applicant: Samsung Display Co., Ltd., Yongin-si (KR)

(72) Inventors: Kyungseop Kim, Hwaseong-si (KR); Jung-Moo Hong, Seongnam-si (KR); Jinbo Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/067,504

(22) Filed: Oct. 9, 2020

(65) Prior Publication Data

US 2021/0109619 A1 Apr. 15, 2021

(30) Foreign Application Priority Data

Oct. 14, 2019 (KR) .......................... 10-2019-0126951

(51) Int. Cl.
*G06F 3/041* (2006.01)
*G06F 3/044* (2006.01)
*H10K 59/40* (2023.01)

(52) U.S. Cl.
CPC .......... *G06F 3/0412* (2013.01); *G06F 3/0446* (2019.05); *H10K 59/40* (2023.02); *G06F 2203/04111* (2013.01); *G06F 2203/04112* (2013.01)

(58) Field of Classification Search
CPC .. G06F 2203/04111; G06F 2203/04112; G06F 3/0412; G06F 3/0445; G06F 3/0446
See application file for complete search history.

(56) References Cited

U.S. PATENT DOCUMENTS

| 10,474,295 | B2 | 11/2019 | Kim et al. | |
| 2018/0329555 | A1* | 11/2018 | Kim | G06F 3/0412 |
| 2018/0350885 | A1 | 12/2018 | Choi et al. | |
| 2019/0042020 | A1* | 2/2019 | Kim | G06F 3/0412 |
| 2020/0026393 | A1* | 1/2020 | Gourevitch | G06F 3/04164 |
| 2020/0042116 | A1* | 2/2020 | Li | G06F 3/0412 |
| 2020/0042120 | A1* | 2/2020 | Gogte | G06F 3/0412 |

FOREIGN PATENT DOCUMENTS

| KR | 10-1675859 B1 | 11/2016 |
| KR | 10-2018-0052830 A | 5/2018 |
| KR | 10-2018-0121436 A | 11/2018 |
| KR | 10-2018-0130797 A | 12/2018 |
| KR | 10-2018-0131010 A | 12/2018 |
| KR | 10-1930247 B1 | 12/2018 |
| KR | 10-1932650 B1 | 12/2018 |

* cited by examiner

*Primary Examiner* — Robin J Mishler
(74) *Attorney, Agent, or Firm* — Lewis Roca Rothgerber Christie LLP

(57) ABSTRACT

A display device includes a display panel having a base surface and an input sensor, which is on the base surface. The input sensor may include a first sensing electrode and a second sensing electrode, which are respectively extended in a first direction and a second direction crossing each other, an insulating layer covering the first and second sensing electrodes, and a first conductive pattern and a second conductive pattern, which are on the insulating layer, are respectively overlapped with the first and second sensing electrodes, and are spaced from each other. It may be possible to suppress a noise issue in the input sensor and to improve touch sensitivity of the input sensor.

16 Claims, 17 Drawing Sheets

DISPLAY DEVICE

CROSS-REFERENCE TO RELATED APPLICATION

This application claims priority to and the benefit of Korean Patent Application No. 10-2019-0126951, filed on Oct. 14, 2019, in the Korean Intellectual Property Office, the entire content of which is hereby incorporated by reference.

BACKGROUND

1. Field

The present disclosure relates to a display device, and in particular, to a display device with an improved touch sensitivity.

2. Description of the Related Art

Various display devices are being developed for use in multimedia devices, such as televisions, mobile phones, tablet computers, navigation systems, and gaming machines. A keyboard or a mouse is used as an input device of the display device. In some cases, a display device includes a touch panel that is used as the input device of the display device.

SUMMARY

Some embodiments of the present disclosure provide a display device with a reduced noise property and an improved touch sensitivity.

According to some embodiments of the present disclosure, a display device includes a display panel having a base surface and an input sensor, which is directly on the base surface. The input sensor may include a first sensing electrode and a second sensing electrode, which are respectively extended in a first direction and a second direction crossing each other, an insulating layer covering the first and second sensing electrodes, and a first conductive pattern and a second conductive pattern, which are located on the insulating layer, are respectively overlapped with the first and second sensing electrodes, and are spaced from each other.

In some embodiments, the first conductive pattern may correspond to a pattern of the first sensing electrode, and the second conductive pattern may correspond to a pattern of the second sensing electrode.

In some embodiments, each of the first and second sensing electrodes may include a plurality of mesh lines.

In some embodiments, each of the first and second conductive patterns may include a plurality of mesh lines.

In some embodiments, an area of the first conductive pattern may be substantially equal to an area of the first sensing electrode, and an area of the second conductive pattern may be substantially equal to an area of the second sensing electrode.

In some embodiments, the first and second conductive patterns may have a thickness ranging from 30 Å to 200 Å.

In some embodiments, the first and second conductive patterns may correspond to floating electrodes.

In some embodiments, the input sensor may further include a sensing region, in which the first and second sensing electrodes are located, and an interconnection region located outside the sensing region. The first and second conductive patterns may be located outside the interconnection region.

In some embodiments, the first sensing electrode may include a plurality of first sensor units arranged along the first direction, and first connecting portions that connect adjacent ones of the first sensor units, and the second sensing electrode includes a plurality of second sensor units arranged along the second direction, and second connecting portions to connect adjacent ones of the second sensor units.

In some embodiments, the insulating layer may include a first insulating layer and a second insulating layer. In some embodiments, a group of connecting portions selected from the first connecting portions and the second connecting portions may be on the base surface. The first insulating layer may be on the selected group of the connecting portions. The first sensor units, the second sensor units, and another group of connecting portions, which are not selected from the first connecting portions and the second connecting portions, may be on the first insulating layer. The second insulating layer may be on the first sensor units, the second sensor units, and the another group of the connecting portions.

In some embodiments, the first and second conductive patterns may be directly on the second insulating layer.

In some embodiments, the first conductive pattern may include a plurality of first sensing portions overlapped with the first sensor units, respectively, and the second conductive pattern may include a plurality of second sensing portions overlapped with the second sensor units, respectively.

In some embodiments, each of the first and second sensor units may include an outer pattern having a zigzag shape, and each of the first and second sensing portions may include an outer pattern that is substantially the same as the outer pattern of a corresponding one of the first and second sensor units.

In some embodiments, the first conductive pattern may further include first bridges connecting adjacent ones of the first sensing portions.

In some embodiments, the second conductive pattern may further include second bridges connecting adjacent ones of the second sensing portions.

In some embodiments, each of the first and second sensor units may include four first outer sides, all of which have the same length, and each of the first and second sensing portions includes four second outer sides, which have the same length as that of the first outer sides.

In some embodiments, the length of the second outer side may range from 3 mm to 4 mm.

In some embodiments, each of the first and second sensing portions may have a hole region therein.

In some embodiments, each of the second sensing portions may have a hole region therein.

According to some embodiments of the present disclosure, a display device includes a display panel having a base surface and an input sensor, which is directly on the base surface. The input sensor may include a first sensing electrode and a second sensing electrode, which are respectively extended in a first direction and a second direction crossing each other, a conductive pattern on the first and second sensing electrodes and overlapped with either of the first and second sensing electrodes, and an insulating layer between the first and second sensing electrodes and the conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
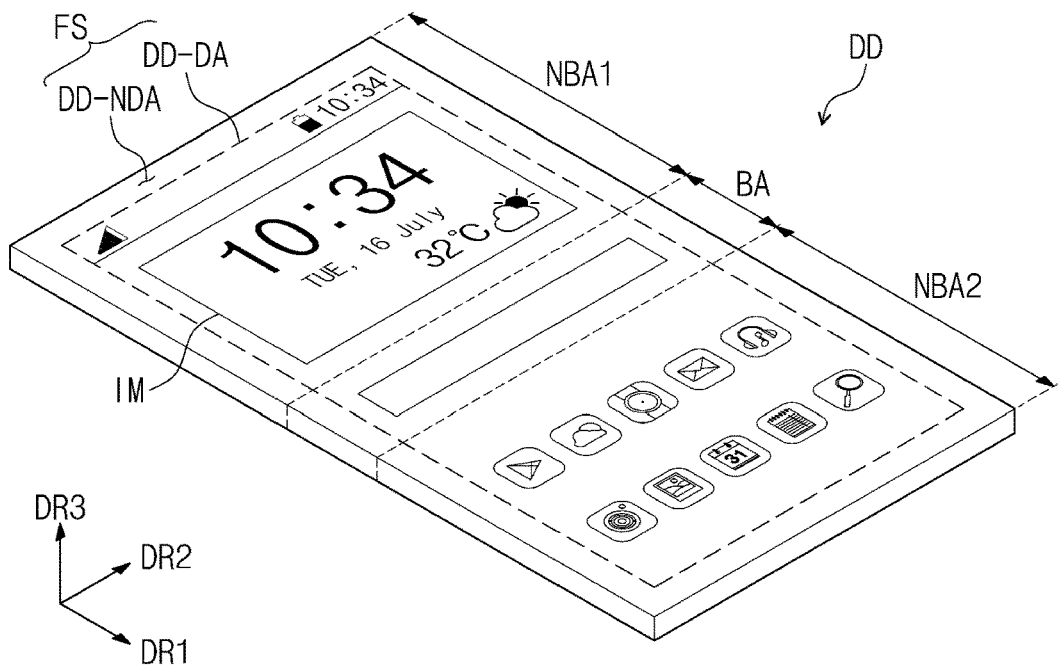
FIG. 1A-1C are perspective views illustrating a display device according to some embodiments of the present disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present disclosure will now be described more fully with reference to the accompanying drawings, in which example embodiments are shown. Example embodiments of the present disclosure may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the present disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the present disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." In addition, the use of alternative language, such as "or," when describing embodiments of the present disclosure, refers to "one or more embodiments of the present disclosure" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein.

Hereinafter, embodiments of the present disclosure are described with reference to the attached drawings.

Figure 1B:
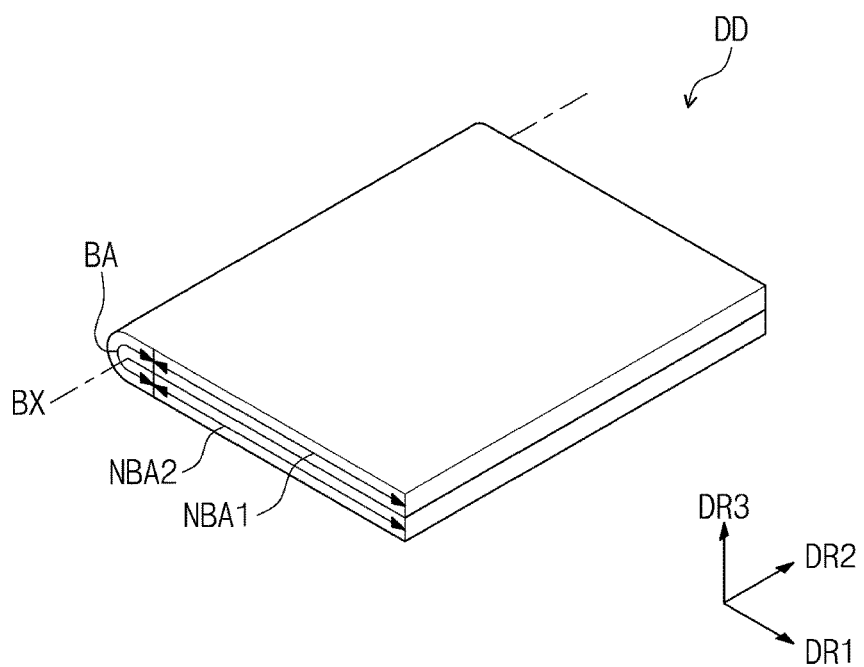
Figure 1C:
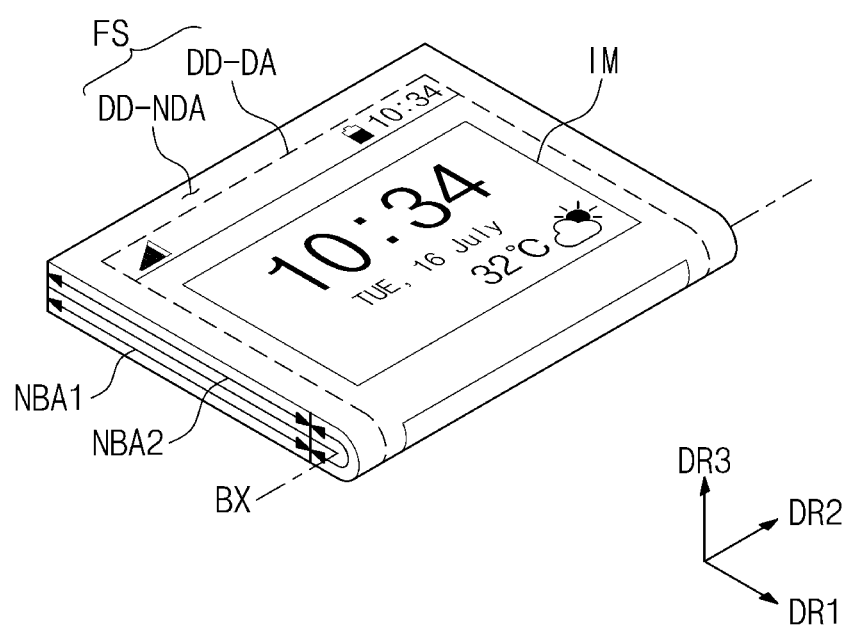

FIGS. 1A-1C are perspective views illustrating a display device DD according to some embodiments of the present disclosure.

As shown in FIGS. 1A-1C, a display surface FS, which is used to display an image IM, may be parallel to a plane defined by a first direction axis DR1 and a second direction axis DR2 (e.g., the display surface FS may extend in the first direction DR1 and the second direction DR2). Hereinafter, a third direction axis DR3 may be used to refer to a thickness direction of the display device DD (i.e., a direction normal to the display surface FS). A front or top surface and a rear or bottom surface of each member may be distinguished, based on the third direction axis DR3. However, directions indicated by the first to third direction axes DR1, DR2, and DR3 may be relative concepts, and in certain embodiments, they may be changed to indicate other directions. Hereinafter, first to third directions may be directions indicated by the first to third direction axes DR1, DR2, and DR3, respectively, and will be identified with the same reference numbers.

As shown in FIGS. 1A-1C, the display device DD may include a plurality of regions defined according to its operation mode. The display device DD may include a bending region BA, which may be bent along a bending axis BX, and a first non-bending region NBA1 and a second non-bending region NBA2, which are not bent (e.g., the first non-bending region NBA1 and the second non-bending region NBA2 may be planer surfaces that may be relatively rigid and non-bendable). As shown in FIG. 1B, the display device DD may be bent inward such that the display surface FS of the first non-bending region NBA1 faces the display surface FS of the second non-bending region NBA2. In some embodiments, as shown in FIG. 1C, the display device DD may be bent outward such that the display surface FS is exposed to the outside (e.g., the display surface FS of the first non-bending region NBA1 and the display surface FS of the second non-bending region NBA2 may be visible from the outside). In some embodiments where, as shown in FIGS. 1A-1C, the display device repeats the folding and unfolding operations, such a display device may be defined as a foldable display device.

In some embodiments, the display device DD may include a plurality of bending regions BA. In some embodiments, the bending region BA may be defined, based on a shape of the display device DD manipulated by a user. For example, unlike what is shown in FIGS. 1B and 1C, the bending region BA may be defined to be parallel to the first direction axis DR1 or parallel to a diagonal direction. An area of the bending region BA may not be fixed and may vary depending on its curvature radius. In some embodiments, the display device DD may be configured to repeat the folding and unfolding operations illustrated in FIGS. 1A and 1B.

In some embodiments, an example, in which the display device DD is foldable, is illustrated, but the present disclosure is not limited to this example. The display device DD may have a curved display surface or may have a three-dimensional display surface (e.g., shaped like a surface of a polygonal pillar) including a plurality of display regions, which are oriented in different directions. Furthermore, in some embodiments, the display device DD may be a rigid display device with a flat display surface FS. In certain embodiments, the display device DD may have at least one edge portion that is bent or curved.

In the present disclosure, an example, in which the display device DD is used as a part of a cellphone, is illustrated, but the present disclosure is not limited to this example. For example, the display device DD may be used for large-sized electronic devices (e.g., television sets and monitors) or small or medium-sized electronic devices (e.g., tablets, car navigation systems, game machines, and smart watches).

As shown in FIGS. 1A-1C, the display surface FS may include a display region DD-DA, which is used to display the image IM, and a non-display region DD-NDA, which is provided to be adjacent to the display region DD-DA (e.g., the non-display region DD-NDA may surround the display region DD-DA along the periphery of the display region DD-DA in the first direction DR1 and the second direction DR2 in each of the first non-bending region NBA1 and the second non-bending region NBA2). The non-display region DD-NDA may not be used to display an image. As shown in FIG. 1A, the image IM may be displayed in the form including of application icons. As an example, the display region DD-DA may have a rectangular shape. The non-display region DD-NDA may enclose the display region DD-DA. However, the present disclosure is not limited to this example, and in certain embodiments, the shapes of the display and non-display regions DD-DA and DD-NDA may be variously changed in a complementary manner.

Figure 2:
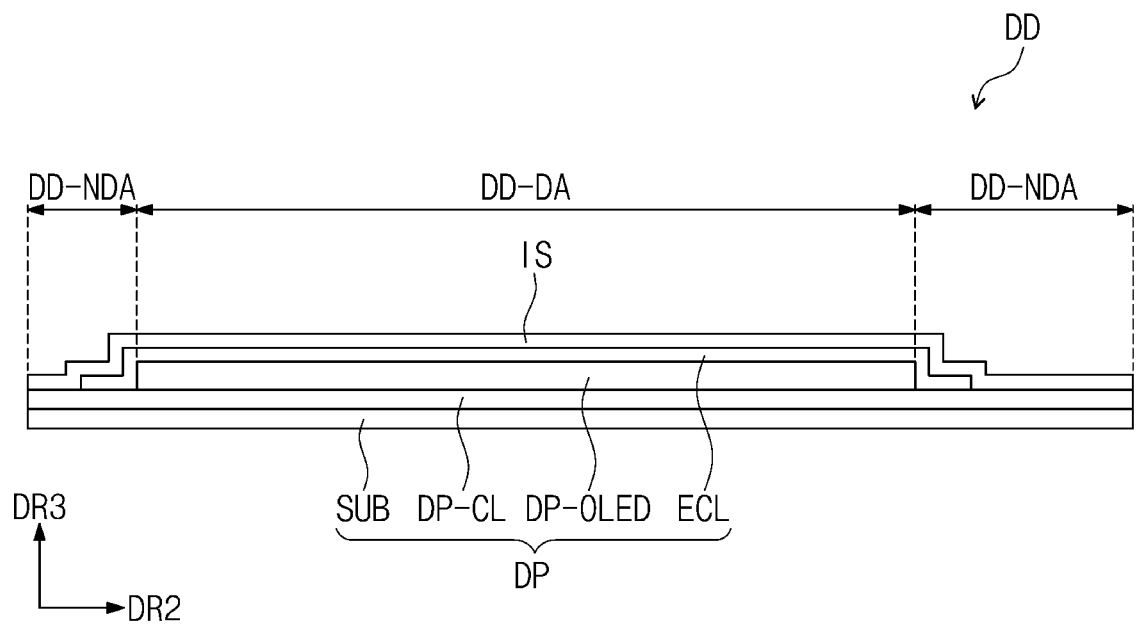
FIG. 2 is a sectional view illustrating a display device according to some embodiments of the present disclosure.

FIG. 2 is a sectional view illustrating the display device DD according to some embodiments of the present disclosure. For example, FIG. 2 illustrates a cross section, which is taken to be parallel to the second and third direction axes DR2 and DR3 (e.g., FIG. 2 illustrates a cross-sectional view of the display device DD taken along the second direction DR2 and the third direction DR3).

As shown in FIG. 2, the display device DD may include a display panel DP and an input sensor IS. The display panel DP may generate an image, and the input sensor IS may obtain information on coordinates of an external input (e.g., a touch event). Although not shown, the display device DD according to some embodiments of the present disclosure may further include a protection member, which is disposed on a bottom surface of the display panel DP, and an anti-reflection member and/or a window member, which are disposed on a top surface of the input sensor IS.

The display panel DP may be a light-emitting type display panel, but the present disclosure is not limited to a specific type of the display panel DP. For example, the display panel DP may be an organic light emitting display panel or a quantum dot light-emitting display panel. The organic light emitting display panel may include an organic light emitting material, which is used as its light-emitting layer. The quantum-dot light-emitting display panel may include quantum dots and quantum rods which are used as its light-emitting layer. For the sake of simplicity, the description that follows will refer to an example in which the display panel DP is the organic light emitting display panel.

The display panel DP may include a base layer SUB and a circuit device layer DP-CL, a display element layer DP-OLED, and an encapsulation layer ECL, which are disposed (e.g., sequentially disposed) on the base layer SUB. Although not shown, the display panel DP may further include functional layers, such as an anti-reflection layer and a refractive index controlling layer.

The base layer SUB may include a flexible film. The base layer SUB may include at least one of a plastic substrate, a glass substrate, a metal substrate, or a substrate made of an organic/inorganic composite material. The display and non-display regions DD-DA and DD-NDA described with reference to FIG. 1 may be defined in the base layer SUB in the same manner.

The circuit device layer DP-CL may include at least one intermediate insulating layer and a circuit device. The intermediate insulating layer may include at least one intermediate inorganic layer and at least one intermediate organic layer. The circuit device may include signal lines, a pixel driving circuit, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and/or etching process.

The display element layer DP-OLED may include organic light emitting diodes (OLEDs). The display element layer DP-OLED may further include an organic layer such as a pixel definition layer.

The encapsulation layer ECL may seal or encapsulate the display element layer DP-OLED. The encapsulation layer ECL may include at least one inorganic layer (hereinafter, an inorganic encapsulation layer). The encapsulation layer ECL may further include at least one organic layer (hereinafter, an organic encapsulation layer). The inorganic encapsulation layer may protect the display element layer DP-OLED from moisture or oxygen, and the organic encapsulation layer may protect the display element layer DP-OLED from a contamination material such as dust particles. The inorganic encapsulation layer may be formed of or include at least one of silicon nitride, silicon oxynitride, silicon oxide, titanium oxide, or aluminum oxide. The organic encapsulation layer may be formed of or include at least one of acrylic-based organic materials, but the present disclosure is not limited thereto.

The input sensor IS may be directly disposed on a base surface defined by the display panel DP. In the present disclosure (specification), the expression "be directly disposed on" is used to represent that one layer are successively formed on another layer, without an additional adhesive layer interposed therebetween. The base surface may be a top surface of the encapsulation layer ECL or may be a top surface of another functional layer disposed on the encapsulation layer ECL. However, the base surface may not be limited to these examples, and in each step of the fabrication process, a top surface of the topmost layer of the display panel DP may be chosen as the base surface. Meanwhile, the input sensor IS may be directly disposed on the base surface provided by the display panel DP, and in such a case, a base substrate of a touch panel may be omitted and a total thickness of the display device DD may be reduced.

Figure 6:
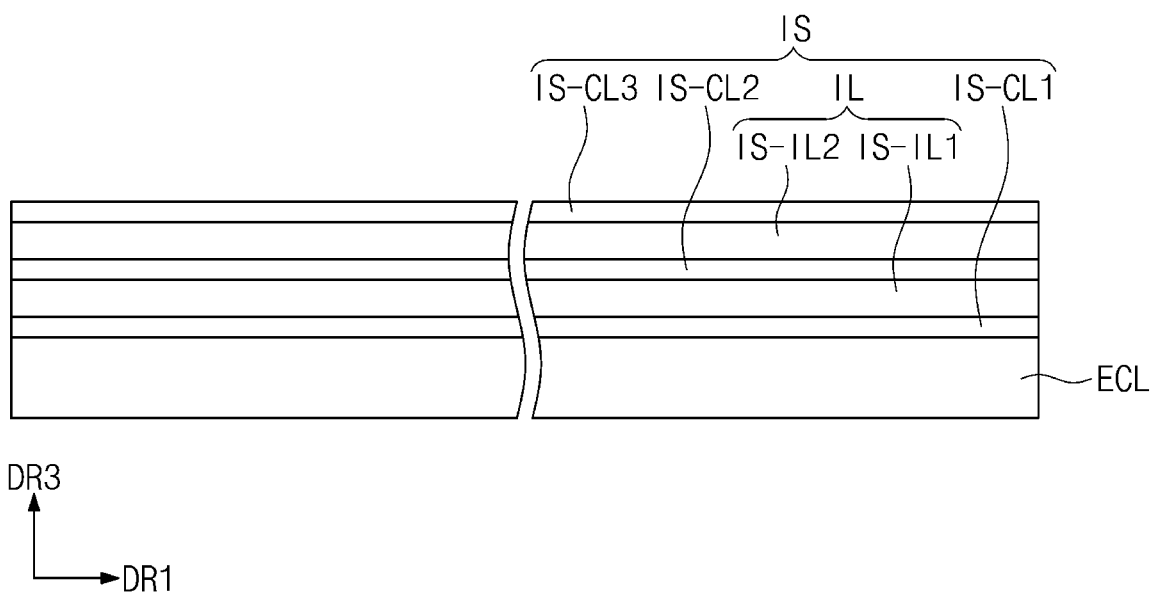
FIG. 6 is a sectional view illustrating an input sensor according to some embodiments of the present disclosure.

The input sensor IS may have a multi-layered structure. In some embodiments, the input sensor IS may include one or more conductive layers. The input sensor IS may include at least one insulating layer IL (for example, as shown in FIG. 6).

The input sensor IS may sense an external input, for example, using a capacitance-sensing method. The present disclosure is not limited to a specific sensing method of the input sensor IS, and in some embodiments, the input sensor IS may sense an external input in an electromagnetic induction manner or a pressure-sensing manner.

Figure 3:
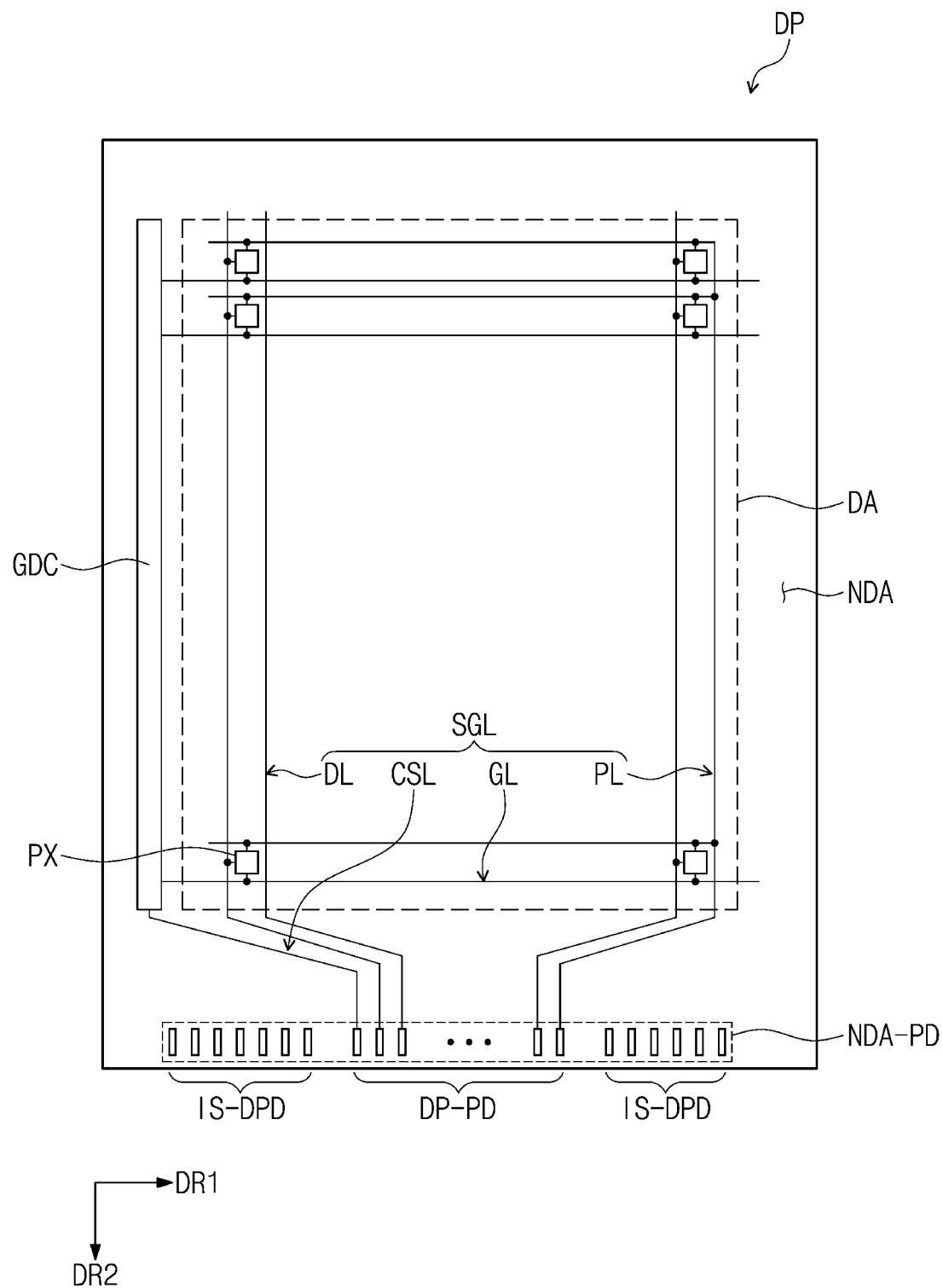
FIG. 3 is a plan view illustrating a display panel according to some embodiments of the present disclosure.
Figure 4:
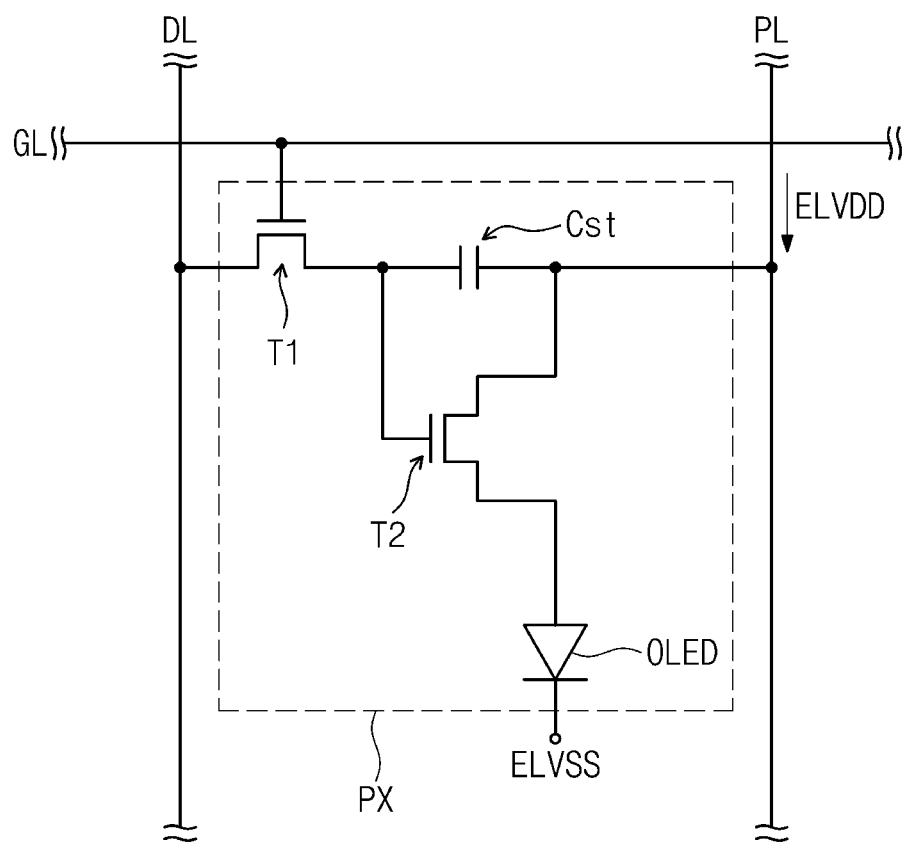
FIG. 4 is an equivalent circuit diagram illustrating a pixel according to some embodiments of the present disclosure.
Figure 5:
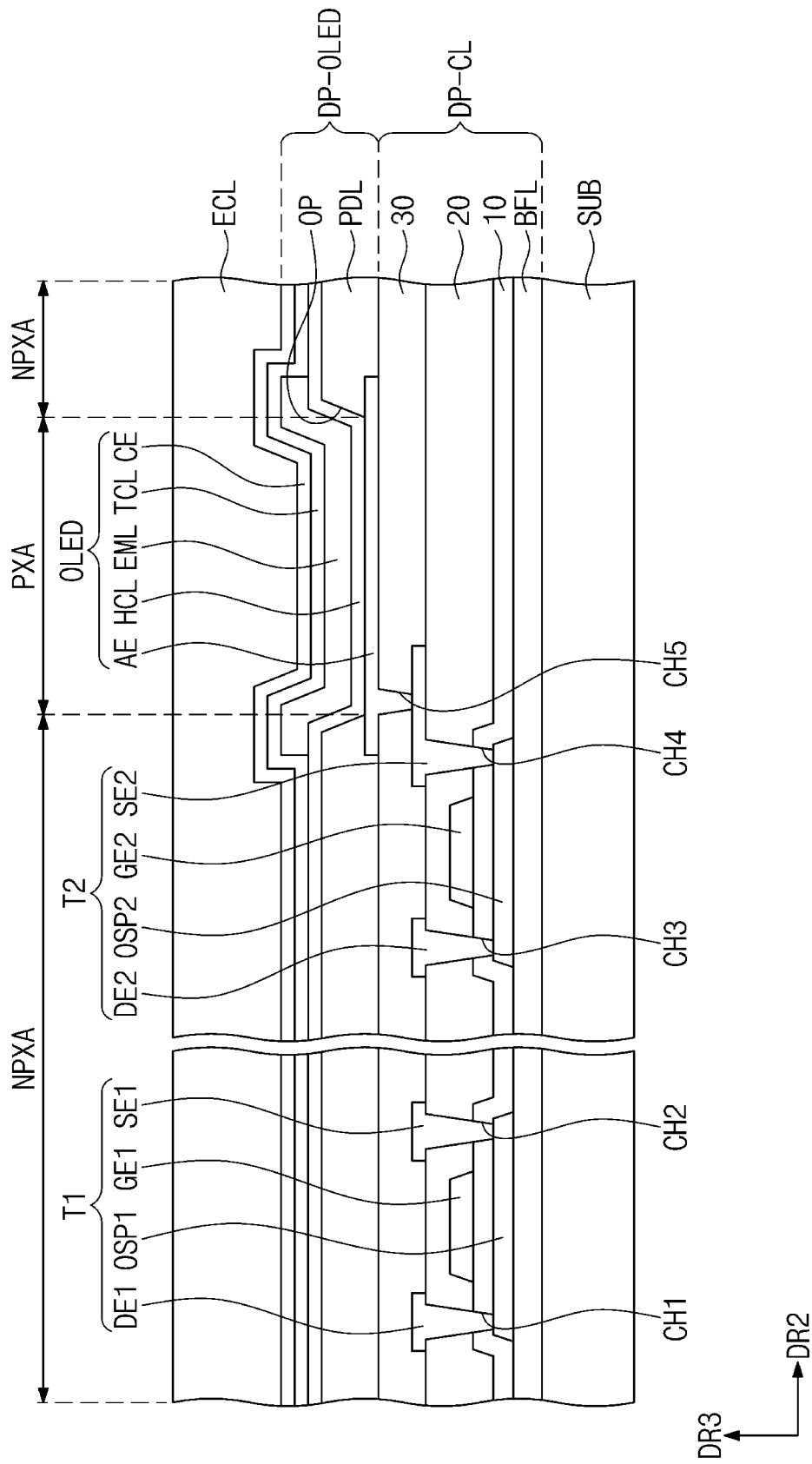
FIG. 5 is an enlarged sectional view of a display panel according to some embodiments of the present disclosure.

FIG. 3 is a plan view illustrating the display panel DP according to some embodiments of the present disclosure. FIG. 4 is an equivalent circuit diagram illustrating a pixel PX according to some embodiments of the present disclosure. FIG. 5 is an enlarged sectional view of the display panel DP according to some embodiments of the present disclosure.

As shown in FIG. 3, the display panel DP may include a display region DA and a non-display region NDA, when viewed in a plan view. In the example embodiment of FIG. 3, the non-display region NDA may be defined along an edge of the display region DA. The display and non-display regions DA and NDA of the display panel DP may correspond to the display and non-display regions DD-DA and DD-NDA, respectively, of the display device DD shown in FIG. 1. In some embodiments, depending on the structure or design of the display panel DP, the display and non-display regions DA and NDA of the display panel DP may be defined to be different from the display and non-display regions DD-DA and DD-NDA of the display device DD of FIG. 1.

The display panel DP may include a driving circuit GDC, a plurality of signal lines SGL, and a plurality of pixels PX. The pixels PX may be disposed in the display region DA. Each of the pixels PX may include an organic light emitting diode (OLED) and a pixel driving circuit connected thereto. The driving circuit GDC, the signal lines SGL, and the pixel driving circuit may be included in the circuit device layer DP-CL shown in FIG. 2.

The driving circuit GDC may include a scan driving circuit. The scan driving circuit may generate a plurality of scan signals and may sequentially output the scan signals to a plurality of scan lines GL, which will be described below. In some embodiments, the driving circuit GDC may further output other control signals to the driving circuit of the pixels PX.

The driving circuit GDC may include a plurality of thin-film transistors (TFTs) that are formed by the same process as that for the driving circuit of the pixels PX (e.g., by a low temperature polycrystalline silicon (LTPS) process or a low temperature polycrystalline oxide (LTPO) process).

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may provide control signals to the driving circuit GDC.

Figure 7A:
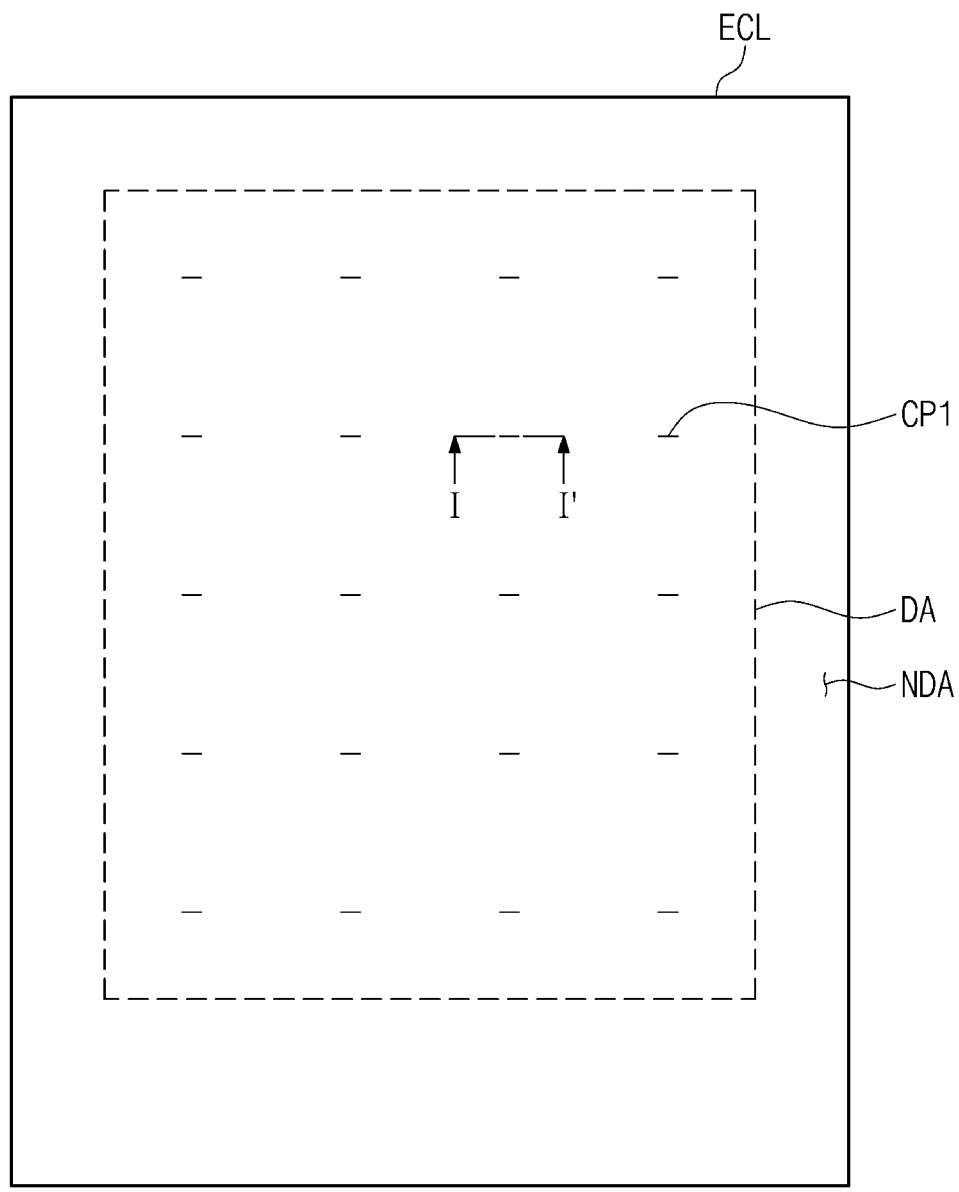
FIG. 7A is a plan view illustrating a first conductive layer of an input sensor according to some embodiments of the present disclosure.
Figure 7B:
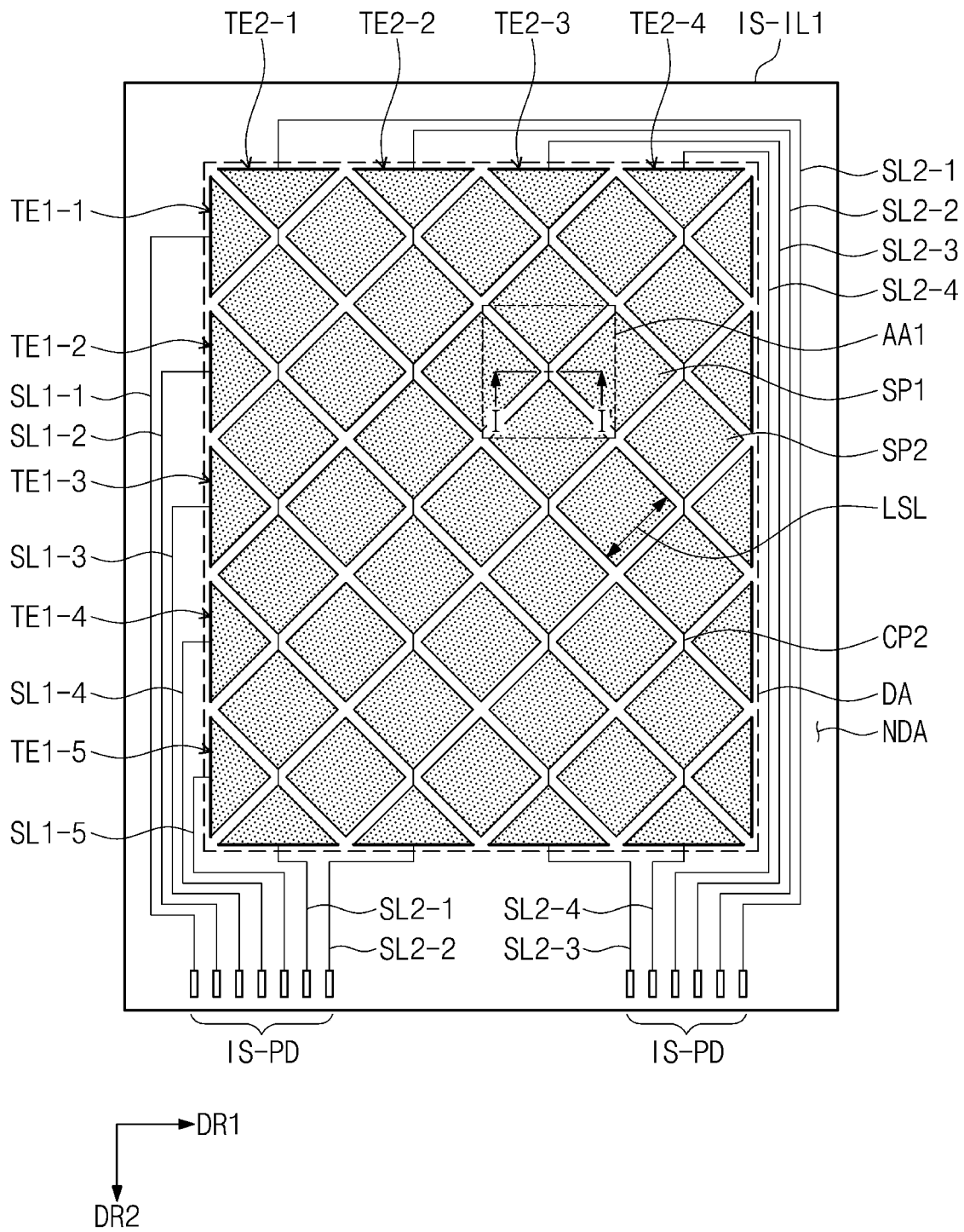
FIG. 7B is a plan view illustrating a second conductive layer of an input sensor according to some embodiments of the present disclosure.

The display panel DP may include signal pads DP-PD, which are connected to ends of the signal lines SGL. The signal pads DP-PD may constitute a circuit device. A region of the non-display region NDA, in which the signal pads DP-PD are disposed, may be defined as a pad region NDA-PD. Dummy touch pads IS-DPD, which are connected to touch signal lines SL1-1 to SL1-5 and SL2-1 to SL2-4 (for example, as shown in FIG. 7B), may be further disposed in the pad region NDA-PD, and here, the touch signal lines SL1-1 to SL1-5 and SL2-1 to SL2-4 will be described in more detail below. The signal pads DP-PD and the dummy touch pads IS-DPD may be formed on the same layer as that under the scan line GL or the data line DL (e.g., see FIG. 5), which will be described in more detail below, by the same process.

FIG. 4 illustrates an example of the pixel PX, which is connected to one of the scan lines GL, one of the data lines DL, and the power line PL. However, the present disclosure is not limited to this example, and elements constituting the pixel PX may be variously changed.

The organic light emitting diode OLED may be a top-emission type diode or a bottom-emission type diode. The pixel PX may include a first or switching transistor T1, a second or driving transistor T2, and a capacitor Cst, which are used as a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

If a scan signal is applied to a scan line GL, the first transistor T1 may output a data signal, which is applied to the data line DL, in response to the scan signal. The capacitor Cst may be charged to have a voltage corresponding to the data signal provided from the first transistor T1.

The second transistor T2 may be connected to the organic light emitting diode OLED. The second transistor T2 may control a driving current flowing through the organic light emitting diode OLED, based on an amount of electric charges stored in the capacitor Cst.

FIG. 5 illustrates a section of a portion of the display panel DP corresponding to the equivalent circuit diagram of FIG. 4, according to some embodiments of the present disclosure. In the example embodiment of FIG. 5, The circuit device layer DP-CL, the display element layer DP-OLED, and the encapsulation layer ECL may be sequentially stacked on the base layer SUB.

The circuit device layer DP-CL may include at least one inorganic layer, at least one organic layer, and a circuit device. In the present embodiment, the circuit device layer DP-CL may include a buffer layer BFL, a first intermediate inorganic layer 10, and a second intermediate inorganic layer 20, which are formed of inorganic materials, and an intermediate organic layer 30, which is formed of an organic material.

The inorganic materials may include silicon nitride, silicon oxynitride, silicon oxide, and so forth. The organic material may include at least one of acrylic resins, methacryl resins, polyisoprene resins, vinyl resins, epoxy resins, urethane resins, cellulose resins, siloxane resins, polyimide resins, polyamide resins, or perylene resins. The circuit device layer DP-CL may include conductive patterns and/or semiconductor patterns.

The buffer layer BFL may reinforce an adhesion strength between the base layer SUB and the conductive or semiconductor patterns. Although not shown, a barrier layer may be further disposed on the top surface of the base layer SUB to prevent a contamination material from entering the circuit device layer DP-CL (e.g., the barrier layer may substantially protect the circuit device layer DP-CL from being exposed to external contamination materials). In some embodiments, at least one of the buffer layer BFL and the barrier layer may be omitted.

A semiconductor pattern OSP1 (hereinafter, a first semiconductor pattern) of the first transistor T1 and a semiconductor pattern OSP2 (hereinafter, a second semiconductor pattern) of the second transistor T2 may be disposed on the buffer layer BFL. The first and second semiconductor patterns OSP1 and OSP2 may be formed of or include at least one of amorphous silicon, poly silicon, or metal oxide semiconductor materials.

The first intermediate inorganic layer 10 may be disposed on the first and second semiconductor patterns OSP1 and OSP2. A control electrode GE1 (hereinafter, a first control electrode) of the first transistor T1 and a control electrode GE2 (hereinafter, a second control electrode) of the second transistor T2 may be disposed on the first intermediate inorganic layer 10. The first control electrode GE1 and the second control electrode GE2 may be fabricated by the same photolithography process as that for the scan lines GL (e.g., see FIG. 4).

The second intermediate inorganic layer 20 may be disposed on the first intermediate inorganic layer 10 to cover the first control electrode GE1 and the second control electrode GE2. An input electrode DE1 and an output electrode SE1 (hereinafter, a first input electrode and a first output electrode) of the first transistor T1 and an input electrode DE2 and an output electrode SE2 (hereinafter, a second input electrode and a second output electrode) of the second transistor T2 may be disposed on the second intermediate inorganic layer 20.

The first input electrode DE1 and the first output electrode SE1 may be respectively connected to the first semiconductor pattern OSP1 through a first penetration hole CH1 and a second penetration hole CH2, which are formed to penetrate the first intermediate inorganic layer 10 and the second intermediate inorganic layer 20. The second input electrode DE2 and the second output electrode SE2 may be respectively connected to the second semiconductor pattern OSP2 through a third penetration hole CH3 and a fourth penetration hole CH4, which are formed to penetrate the first intermediate inorganic layer 10 and the second intermediate inorganic layer 20. In some embodiments, at least one of the first transistor T1 and the second transistor T2 may be provided to have a bottom gate structure.

The intermediate organic layer 30 may be disposed on the second intermediate inorganic layer 20 to cover the first input electrode DE1, the second input electrode DE2, the first output electrode SE1, and the second output electrode SE2. The intermediate organic layer 30 may be provided to have a flat surface (e.g., a flat top surface).

The display element layer DP-OLED may be disposed on the intermediate organic layer 30. The display element layer DP-OLED may include a pixel definition layer PDL and the organic light emitting diode OLED. The pixel definition layer PDL may be formed of or include an organic material, like the intermediate organic layer 30. A first electrode AE of the organic light emitting diode OLED may be disposed on the intermediate organic layer 30. The first electrode AE may be connected to the second output electrode SE2 through a fifth penetration hole CH5 penetrating the intermediate organic layer 30. An opening OP may be defined in the pixel definition layer PDL. The opening OP of the pixel definition layer PDL may expose at least a portion of the first electrode AE of the organic light emitting diode OLED.

The pixel PX may be disposed in a pixel region, when viewed in a plan view. The pixel region may include a light-emitting region PXA and a non-light-emitting region NPXA adjacent to the light-emitting region PXA. The non-light-emitting region NPXA may enclose the light-emitting region PXA. In the example embodiment of FIG. 5, the light-emitting region PXA may be defined to correspond to a region of the first electrode AE exposed by the opening OP.

A hole control layer HCL may be disposed in both of the light-emitting region PXA and the non-light-emitting region NPXA. In the light-emitting region PXA of the pixel PX, the hole control layer HCL may be disposed on the first electrode AE of the organic light emitting diode OLED on a region exposed by the opening OP. Although not shown, a common layer, such as the hole control layer HCL, may be provided in common in the pixels PX (e.g., see FIG. 3).

An emission layer EML may be disposed on the hole control layer HCL. The emission layer EML may be disposed on a region corresponding to the opening OP. In other words, the emission layer EML may include a plurality of separate patterns, each of which is provided in a corresponding one of the pixels PX. The emission layer EML may be formed of or include at least one of organic or inorganic materials. In the example embodiment of FIG. 5, the emission layer EML is illustrated to have a patterned structure, but in some embodiments, the emission layer EML may be disposed in common in the plurality of pixels. In some embodiments, the emission layer EML may generate light of white color. In some embodiments, the emission layer EML may have a multi-layered structure.

An electron control layer TCL may be disposed on the emission layer EML. Although not shown, the electron control layer TCL may be formed in common in the plurality of the pixels PX (e.g., see FIG. 3).

A second electrode CE of the organic light emitting diode OLED may be disposed on the electron control layer TCL. The second electrode CE may be disposed in common in the plurality of the pixels PX. In some embodiments, the second electrode CE may be a common electrode.

The encapsulation layer ECL may be disposed on the second electrode CE of the organic light emitting diode OLED. The encapsulation layer ECL may be disposed in common in the plurality of the pixels PX. In the example embodiment of FIG. 5, the encapsulation layer ECL may directly cover the second electrode CE. In some embodiments, a capping layer may be further disposed between the encapsulation layer ECL and the second electrode CE to cover the second electrode CE. Here, the encapsulation layer ECL may directly cover the capping layer.

Figure 7C:
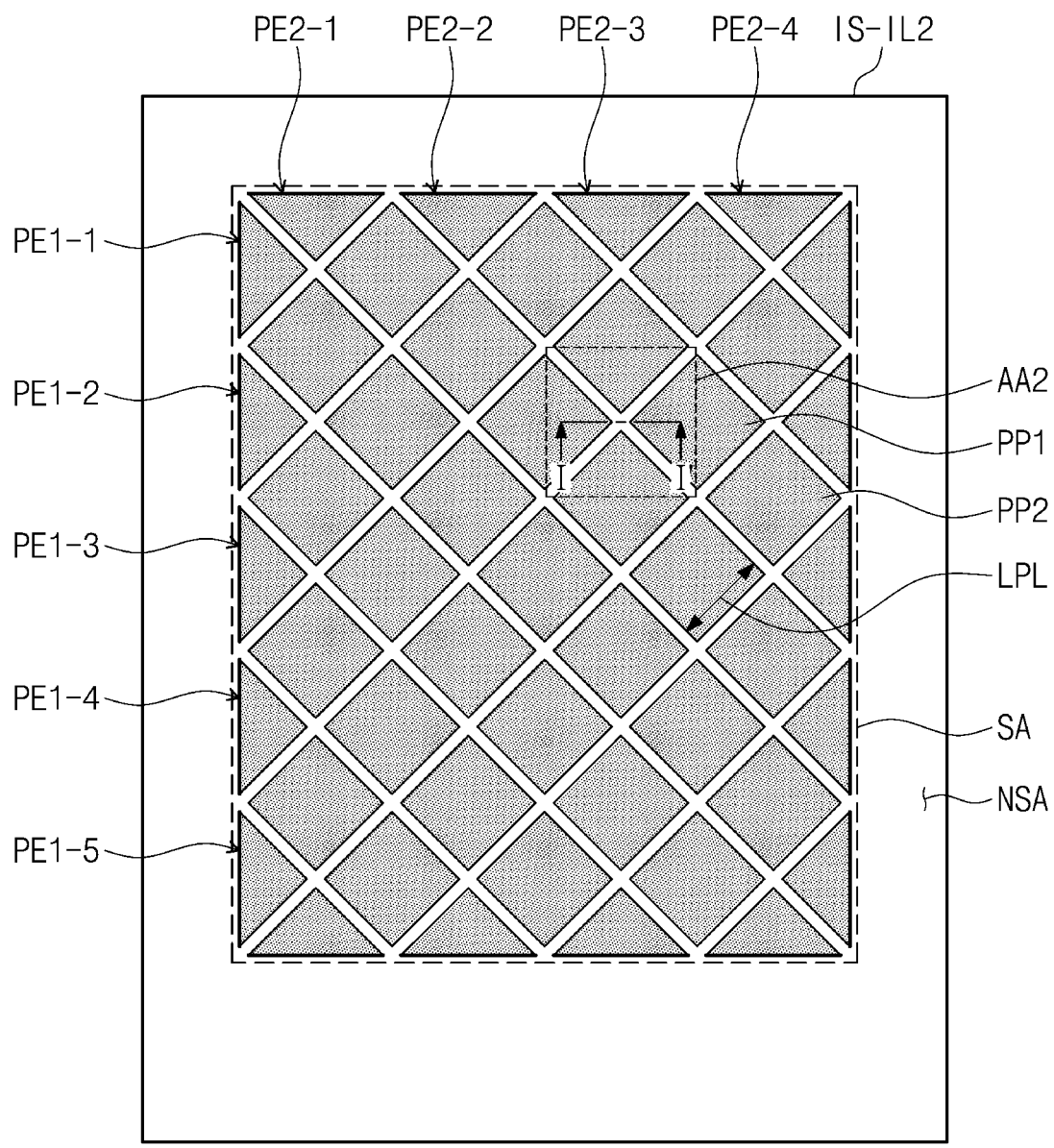
FIG. 7C is a plan view illustrating a third conductive layer of an input sensor according to some embodiments of the present disclosure.
Figure 7D:
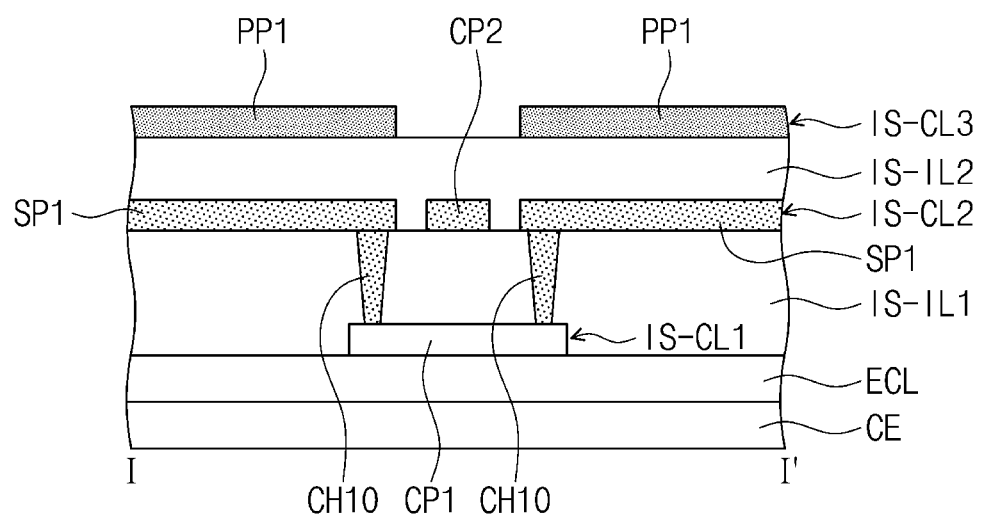
FIG. 7D is a sectional view taken along a line I-I' of FIGS. 7A-7C, according to some embodiments of the present disclosure.

FIG. 6 is a sectional view illustrating an input sensor according to some embodiments of the present disclosure. FIG. 7A is a plan view illustrating a first conductive layer of an input sensor according to some embodiments of the present disclosure. FIG. 7B is a plan view illustrating a second conductive layer of an input sensor according to some embodiments of the present disclosure. FIG. 7C is a plan view illustrating a third conductive layer of an input sensor according to some embodiments of the present disclosure. FIG. 7D is a sectional view taken along a line I-I' of FIGS. 7A-7C, according to some embodiments of the present disclosure.

As shown in FIG. 6, the input sensor IS may include a first conductive layer IS-CL1, a first insulating layer IS-IL1, a second conductive layer IS-CL2, a second insulating layer IS-IL2, and a third conductive layer IS-CL3.

In the example embodiment of FIG. 6, the first conductive layer IS-CL1 may be directly disposed on the encapsulation layer ECL. However, the present disclosure is not limited to this example or a specific embodiment, and in some embodiments, another inorganic or organic layer may be further disposed between the first conductive layer IS-CL1 and the encapsulation layer ECL. In some embodiments, the first insulating layer IS-IL1, the second conductive layer IS-CL2, the second insulating layer IS-IL2, and the third conductive layer IS-CL3 may be sequentially disposed on the first conductive layer IS-CL1. In some embodiments, the second insulating layer IS-IL2 may be omitted, and an optical member or an adhesive layer may be provided to have the protection function, instead of the second insulating layer IS-IL2.

Each of the first conductive layer IS-CL1, the second conductive layer IS-CL2, and the third conductive layer IS-CL3 may have a single-layered structure or may have a multi-layered structure including layers stacked in the third direction axis DR3. The single-layered conductive layer may include a metal layer or a transparent conductive layer. The metal layer may be formed of or include at least one of molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium tin zinc oxide (ITZO). In some embodiments, the transparent conductive layer may include at least one of PEDOT, metal nano wire, or graphene.

The multi-layered conductive layer may include a plurality of metal layers. For example, such metal layers constituting the conductive layer may have a triple-layered structure including, for example, titanium/aluminum/titanium layers. The multi-layered conductive layer may include a single metal layer and a transparent conductive layer. The multi-layered conductive layer may include a plurality of metal layers and at least one transparent conductive layer.

Each of the first and second conductive layers IS-CL1 and IS-CL2 may include a plurality of conductive patterns. The conductive patterns may include sensing electrodes and sensing signal lines. The third conductive layer IS-CL3 may include conductive patterns overlapped with the sensing electrodes.

Each of the first and second insulating layers IS-IL1 and IS-IL2 may include an inorganic material or an organic material. At least one of the first and second insulating layers IS-IL1 and IS-IL2 may include an inorganic layer. The inorganic layer may be formed of or include at least one of aluminum oxide, titanium oxide, silicon oxide, silicon oxynitride, zirconium oxide, or hafnium oxide.

At least one of the first and second insulating layers IS-IL1 and IS-IL2 may include an organic layer. The organic layer may include at least one of acrylic resins, methacryl resins, polyisoprene resins, vinyl resins, epoxy resins, urethane resins, cellulose resins, siloxane resins, polyimide resins, polyamide resins, or perylene resins. For example, the first insulating layer IS-IL1 may include an inorganic layer, and the second insulating layer IS-IL2 may include an organic layer.

As shown in FIGS. 7A-7B, the input sensor IS may include first sensing electrodes TE1-1 to TE1-5, first sensing signal lines SL1-1 to SL1-5 connected to the first sensing electrodes TE1-1 to TE1-5, second sensing electrodes TE2-1 to TE2-4, second sensing signal lines SL2-1 to SL2-4 connected to the second sensing electrodes TE2-1 to TE2-4, and sensing pads IS-PD connected to the first sensing signal lines SL1-1 to SL1-5 and the second sensing signal lines SL2-1 to SL2-4. The first sensing electrodes TE1-1 to TE1-5 may be disposed to cross the second sensing electrodes TE2-1 to TE2-4. The first sensing electrodes TE1-1 to TE1-5 may be arranged in the second direction DR2, and each of the first sensing electrodes TE1-1 to TE1-5 may be extended in the first direction DR1. The second sensing electrodes TE2-1 to TE2-4 may be arranged in the first direction DR1, and each of the second sensing electrodes TE2-1 to TE2-4 may be extended in the second direction DR2.

The first sensing signal lines SL1-1 to SL1-5 may be connected to one ends of the first sensing electrodes TE1 to TE1 respectively. The second sensing signal lines SL2-1 to SL2-4 may be connected to both ends of the second sensing electrodes TE2-1 to TE2-4, respectively. In some embodiments, the first sensing signal lines SL1-1 to SL1-5 may be connected to both ends of the first sensing electrodes TE1-1 to TE1-5. In some embodiments, the second sensing signal lines SL2-1 to SL2-4 may be connected to one ends of the second sensing electrodes TE2-1 to TE2-4, respectively.

In some embodiments, the first sensing signal lines SL1-1 to SL1-5, the second sensing signal lines SL2-1 to SL2-4, and the sensing pads IS-PD may be replaced with a circuit substrate, which is separately fabricated, or the like. In some embodiments, the sensing pads IS-PD may be omitted, and the first sensing signal lines SL1-1 to SL1-5 and the second sensing signal lines SL2-1 to SL2-4 may be connected to dummy touch pads IS-DPD shown in FIG. 3.

In some embodiments, the input sensor IS may sense an external input in a mutual-capacitance manner and/or in a self-capacitance manner. The input sensor IS may include at least one insulating layer IL. The insulating layer IL may cover the first sensing electrodes TE1-1 to TE1-5 and the second sensing electrodes TE2-1 to TE2-4. The insulating layer IL may include the first and second insulating layers IS-IL1 and IS-IL2.

Each of the first sensing electrodes TE1-1 to TE1-5 may include first sensor units SP1 and first connecting portions CP1. Each of the second sensing electrodes TE2-1 to TE2-4 may include second sensor units SP2 and second connecting portions CP2.

The first sensor units SP1 may be arranged in the first direction DR1, and the second sensor units SP2 may be arranged in the second direction DR2. Each of the first connecting portions CP1 may connect adjacent ones of the first sensor units SP1 to each other, and each of the second connecting portions CP2 may connect adjacent ones of the second sensor units SP2 to each other.

The second sensing electrodes TE2-1 to TE2-4 may be longer than the first sensing electrodes TE1-1 to TE1-5, and in some embodiments, the numbers of the sensor units (SP1, SP2) and the connecting portions (CP1, CP2) may be greater in the second sensing electrodes TE2-1 to TE2-4 than in the first sensing electrodes TE1-1 to TE1-5. Accordingly, the second sensing electrodes TE2-1 to TE2-4 may have an area greater than that of the first sensing electrodes TE1-1 to TE1-5. In example embodiments of the present disclosure, the "area" may be an area defined by an outer or border line of the sensing electrode. In the example embodiment of FIG. 7B, the first and second sensor units SP1 and SP2 may have substantially the same area. Accordingly, each of the first sensing electrodes TE1-1 to TE1-5 and the second sensing electrodes TE2-1 to TE2-4 may have an area that are respectively in proportion to the numbers of the sensor units thereof.

The first sensing electrodes TE1-1 to TE1-5 including five first sensor units SP1 and the second sensing electrodes TE2-1 to TE2-4 including six second sensor units SP2 are illustrated in the example embodiment of FIG. 7B. In the five first sensor units SP1, each of two opposite units may have a size that is half the size of each of other units interposed therebetween. In the six second sensor units SP2, each of two opposite units may have a size that is half the size of each of other units interposed therebetween.

Referring to FIG. 7C, the third conductive layer IS-CL3 may include a plurality of conductive patterns. The conductive patterns may include first conductive patterns PE1-1 to PE1-5 and second conductive patterns PE2-1 to PE2-4. The third conductive layer IS-CL3 may be disposed on the second insulating layer IS-IL2. The third conductive layer IS-CL3 may have a single-layered structure or may have a multi-layered structure including layers stacked in the third direction axis DR3.

Each of the first conductive patterns PE1-1 to PE1-5 and the second conductive patterns PE2-1 to PE2-4 of the third conductive layer IS-CL3 may include a transparent electrode. The transparent electrode may be formed of or include at least one of metal oxide materials (e.g., indium tin oxide (ITO), indium zinc oxide (IZO), zinc oxide (ZnO), indium tin zinc oxide (ITZO), Al-doped zinc oxide (AZO), indium gallium zinc oxide (IGZO), and Ga-doped zinc oxide (GZO)). The first conductive patterns PE1-1 to PE1-5 and the second conductive patterns PE2-1 to PE2-4 may correspond to floating electrodes. In some embodiments, the third conductive layer IS-CL3 may be directly disposed on the second insulating layer IS-IL2.

In some embodiments, the first and second conductive patterns PE1 and PE2 may have resistance of $10^4\Omega$. In some embodiments, the first and second conductive patterns PE1 and PE2 may have a thickness ranging from 30 Å to 200 Å or in particular, a thickness of 50 Å.

TABLE 1

|  | Thickness of third conductive layer IS-CL3 | | | | |
| --- | --- | --- | --- | --- | --- |
|  | 0 Å | 30 Å | 50 Å | 100 Å | 200 Å |
| Cm (fF) | 892 | 1114 | 1150 | 1149 | 1136 |
| Signal Magnitude | 445 | 532 | 579 | 570 | 563 |
| Current Consumption | 654 | 655 | 657 | 659 | 660 |

Table 1 show a change in touch sensing performance of the display device DD, which is caused by a change in thickness of the third conductive layer IS-CL3. Here, Cm denotes a magnitude of mutual capacitance, and the signal magnitude indicates the touch sensing performance. According to Table 1, the signal magnitude increases when the third conductive layer IS-CL3 is provided on the second insulating layer IS-IL2 than when the third conductive layer IS-CL3 is not provided. The signal magnitude increases with increasing thickness of the third conductive layer IS-CL3 but has the highest value at the thickness of 50 Å. The thickness of the third conductive layer IS-CL3 may correspond to the thickness of the first and second conductive patterns PE1 and PE2. The third conductive layer IS-CL3 including the first conductive patterns PE1-1 to PE1-5 and the second conductive patterns PE2-1 to PE2-4 may improve the touch sensitivity of the display device DD. The first conductive patterns PE1-1 to PE1-5 and the second conductive patterns PE2-1 to PE2-4 may be spaced from each other and may be overlapped with the first sensing electrodes TE1-1 to TE1-5 and the second sensing electrodes TE2-1 to TE2-4, respectively. For example, the first conductive patterns PE1-1 to PE1-5 may be overlapped with the first sensing electrodes TE1 to TE1 respectively, and the second conductive patterns PE2-1 to PE2-4 may be overlapped with the second sensing electrodes TE2-1 to TE2-4, respectively. The first conductive patterns PE1-1 to PE1-5 and the second conductive patterns PE2-1 to PE2-4 of the third conductive layer IS-CL3 may be overlapped with the first sensing electrodes TE1-1 to TE1-5 and the second sensing electrodes TE2-1 to TE2-4, respectively and may be spaced from each other, and in some embodiments may improve the touch sensitivity of the display device DD and effectively suppress a noise issue.

Patterns of the first conductive patterns PE1-1 to PE1-5 may correspond to patterns of the first sensing electrodes TE1-1 to TE1-5, and patterns of the second conductive patterns PE2-1 to PE2-4 may correspond to patterns of the second sensing electrodes TE2-1 to TE2-4. For example, the first conductive patterns PE1-1 to PE1-5 may have substantially the same pattern shape as the first sensing electrodes TE1 to TE1-5, and the second conductive patterns PE2-1 to PE2-4 may have substantially the same pattern shape as the second sensing electrodes TE2-1 to TE2-4.

In some embodiments, the area of each of the first conductive patterns PE1-1 to PE1-5 may be substantially equal to the area of a corresponding one of the first sensing electrodes TE1 to TE1 and the area of each of the second conductive patterns PE2-1 to PE2-4 may be substantially equal to the area of a corresponding one of the second sensing electrodes TE2-1 to TE2-4. However, the present disclosure is not limited to this example, and the area of each of the first conductive patterns PE1-1 to PE1-5 and the second conductive patterns PE2-1 to PE2-4 may be greater or smaller than the area of a corresponding one of the first sensing electrodes TE1 to TE1-5 and the second sensing electrodes TE2-1 to TE2-4.

In some embodiments, when the area of each of the first conductive patterns PE1-1 to PE1-5 and the second conductive patterns PE2-1 to PE2-4 is larger than the area of a corresponding one of the first sensing electrodes TE1 to TE1-5 and the second sensing electrodes TE2-1 to TE2-4, a distance from the first conductive patterns PE1-1 to PE1-5 to the second conductive patterns PE2-1 to PE2-4 may decrease, and when the area of each of the first conductive patterns PE1-1 to PE1-5 and the second conductive patterns PE2-1 to PE2-4 is smaller than the area of a corresponding one of the first sensing electrodes TE1-1 to TE1-5 and the second sensing electrodes TE2-1 to TE2-4, a distance from the first conductive patterns PE1-1 to PE1-5 to the second conductive patterns PE2-1 to PE2-4 may increase.

In some embodiments, when the area of each of the first conductive patterns PE1-1 to PE1-5 and the second conductive patterns PE2-1 to PE2-4 is equal (e.g., substantially equal) to the area of a corresponding one of the first sensing electrodes TE1 to TE1-5 and the second sensing electrodes TE2-1 to TE2-4, each of the first conductive patterns PE1-1 to PE1-5 and the second conductive patterns PE2-1 to PE2-4 may be perfectly (or substantially completely) overlapped with a corresponding one of the first sensing electrodes TE1-1 to TE1-5 and the second sensing electrodes TE2-1 to TE2-4. Here, the area may be an area defined by outer lines of the sensing electrode and the conductive pattern.

Referring to FIG. 7C, the first conductive patterns PE1-1 to PE1-5 may include a plurality of first sensing portions PP1, and the second conductive patterns PE2-1 to PE2-4 may include a plurality of second sensing portions PP2. In some embodiments, the first sensing portions PP1 may be overlapped with the first sensor units SP1, respectively, and the second sensing portions PP2 may be overlapped with the second sensor units SP2, respectively. In some embodiments, the first conductive patterns PE1-1 to PE1-5 and the second conductive patterns PE2-1 to PE2-4 may be disposed in only a sensing region SA and may not be disposed in an interconnection region NSA. The first conductive patterns PE1-1 to PE1-5 and the second conductive patterns PE2-1 to PE2-4 may be disposed in the sensing region SA and may be spaced from the interconnection region NSA by a specific (e.g., a set or predetermined) distance. The sensing region SA may correspond to the display region DA (e.g., see FIG. 7B), and the interconnection region NSA may correspond to the non-display region NDA (e.g., see FIG. 7B).

In some embodiments, each of the first and second sensor units SP1 and SP2 may include four first outer sides LSL, although only the first outer side LSL of the second sensor unit SP2 is illustrated in FIG. 7B. The first outer sides LSL may have the same length. In some embodiments, each of the first and second sensing portions PP1 and PP2 may include four second outer sides LPL, and the second outer sides LPL may have the same lengths as the first outer sides LSL. Here, the first outer side LSL may be an outer line of each sensor unit (e.g., SP1 and SP2) defining a shape of each sensor unit, and the second outer side LPL may be an outer line of each sensing portion defining a shape of each sensing portion (e.g., PP1 and PP2). In some embodiments, the lengths of the second outer sides LPL may range from 3 mm to 4 mm. For example, a length of each of the four second outer sides LPL may range from 3 mm to 4 mm. In some embodiments, where the length of the second outer side LPL ranges from 3 mm to 4 mm, the length of the first outer side LSL may also range from 3 mm to 4 mm; for example, the first and second outer sides LSL and LPL may have substantially the same length.

Referring to FIG. 7D, the first connecting portion CP1 may be disposed on the encapsulation layer ECL. The first sensing electrodes TE1-1 to TE1-5 may be disposed on the first insulating layer IS-IL1 (for example, the first sensing electrodes TE1-1 to TE1-5 may be formed at the second conductive layer IS-CL2). The first conductive patterns PE1-1 to PE1-5 may be disposed on the second insulating layer IS-IL2 (for example, the first conductive patterns PE1-1 to PE1-5 may be formed at the third conductive layer IS-CL3). The second insulating layer IS-IL2 may be disposed between the first conductive patterns PE1-1 to PE1-5 and the first sensing electrodes TE1-1 to TE1-5. In FIG. 7D, the first conductive patterns PE1-1 to PE1-5 may be overlapped with the first sensing electrodes TE1 to TE1 The first conductive patterns PE1-1 to PE1-5 may be spaced from each other at a region, in which the first sensing electrodes TE1-1 to TE1-5 are spaced from each other.

Referring to FIGS. 7A-7D, the first connecting portions CP1 may be disposed on the encapsulation layer ECL. The first connecting portions CP1 may be formed of or include at least one of transparent conductive oxides and/or metallic materials. In some embodiments, the first connecting portions CP1 may include a plurality of metal layers. In some embodiments, instead of the first connecting portions CP1, the second connecting portions CP2 may be disposed on the encapsulation layer ECL.

A first insulating layer IS-IL1 may be disposed on the encapsulation layer ECL to cover the first connecting portions CP1. Contact holes CH10 may be defined in the first insulating layer IS-IL1 to expose the first connecting portions CP1. In other words, the first connecting portions CP1 may be disposed on the base surface (e.g., provided by the display panel DP).

The first sensor units SP1 and the second sensor units SP2 may be disposed on the first insulating layer IS-IL1. In some embodiments, the second connecting portions CP2 may be disposed on the first insulating layer IS-IL1. The second sensor units SP2 and the second connecting portions CP2 may be formed by the same photolithography process, and in this case, the second sensor unit SP2 and the second connecting portion CP2 may be connected to form a single object (for example, see FIG. 8A).

The first sensor units SP1, the second sensor units SP2, and the second connecting portions CP2 may be formed of or include at least one of transparent conductive oxides and/or metallic materials. In some embodiments, the first sensor units SP1, the second sensor units SP2, and the second connecting portions CP2 may include a plurality of metal layers (e.g., Ti/Al/Ti layers).

The first sensing signal lines SL1-1 to SL1-5 and the second sensing signal lines SL2-1 to SL2-4 may be disposed on the first insulating layer IS-IL1. The first sensing signal lines SL1-1 to SL1-5 and the second sensing signal lines SL2-1 to SL2-4 may be disposed in the non-display region NDA. The first sensing signal lines SL1-1 to SL1-5 and the second sensing signal lines SL2-1 to SL2-4 may be formed by the same process as that for the first sensor units SP1 and may have the same stacking structure as the first sensor units SP1.

In some embodiments, a second conductive layer IS-CL2 may include the first sensor units SP1 and the second sensor units SP2, and in some embodiments, it may be possible to increase a distance between the first and second sensor units SP1 and SP2 and the second electrode CE of the display panel DP. In the input sensor IS according to example embodiments of the present disclosure, it may be possible to reduce the parasitic capacitance between the second electrode CE and the first and second sensor units SP1 and SP2, when compared with an input sensor, in which a first conductive layer IS-CL1 includes the first sensor units SP1 and the second sensor units SP2.

A distance between the second electrode CE and the first and second sensor units SP1 and SP2 may range from 0.5 micrometers to 30 micrometers. A sum of thicknesses of insulating layers (e.g., the encapsulation layer ECL and the first insulating layer IS-IL1 of FIG. 6), which are disposed between the second electrode CE and the first and second sensor units SP1 and SP2, may range from 0.5 micrometers to 30 micrometers. To improve the flexibility of the display panel, the total thickness of the insulating layers (e.g., the encapsulation layer ECL and the first insulating layer IS-IL1 of FIG. 6), which are disposed between the second electrode CE and the first and second sensor units SP1 and SP2, may range from 0.5 micrometers to 10 micrometers (in particular, from 0.5 micrometers to 5 micrometers).

As described with reference to FIGS. 1A-1C, it may be relatively easy to prevent or protect internal elements from being cracked during a folding operation, when a foldable display device has a small thickness. In example embodiments of the present disclosure, because the second conductive layer IS-CL2 includes the first sensor units SP1 and the second sensor units SP2, it may be possible to suppress (or significantly reduce) the parasitic capacitance issue, even when the encapsulation layer ECL and the first insulating layer IS-IL1 are thin.

However, the present disclosure is not limited to this example or a specific embodiment, and in some embodiments, the elements constituting the first conductive layer IS-CL1 may be exchanged with the elements constituting the second conductive layer IS-CL2. For example, the second connecting portions CP2 may be disposed on the first insulating layer IS-IL1, and the first sensor units SP1, the second sensor units SP2, and the first connecting portions CP1 may be disposed below the first insulating layer IS-IL1.

Figure 8A:
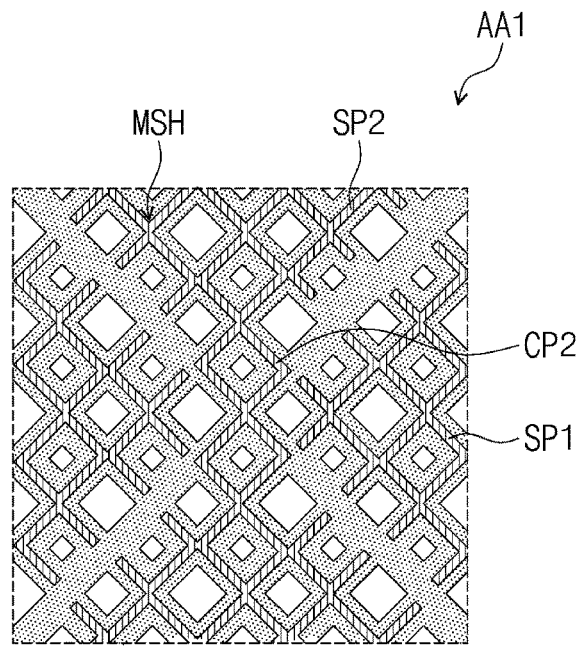
FIG. 8A is an enlarged plan view of a region AA1 of FIG. 7B, according to some embodiments of the present disclosure.
Figure 8B:
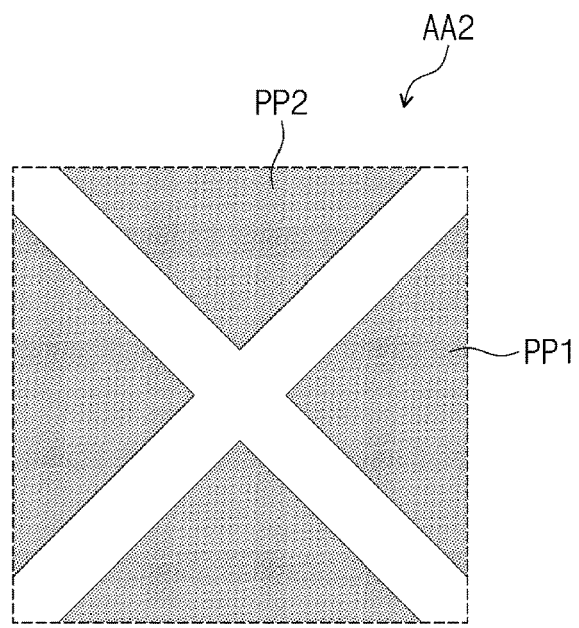
FIG. 8B is an enlarged plan view of a region AA2 of FIG. 7C, according to some embodiments of the present disclosure.

FIG. 8A is an enlarged plan view of a region AA1 of FIG. 7B, according to some embodiments of the present disclosure. FIG. 8B is an enlarged plan view of a region AA2 of FIG. 7C, according to some embodiments of the present disclosure. In FIG. 8A, the first sensor unit SP1 may be spaced from the second sensor unit SP2 by a specific (e.g., a set or predetermined) distance, when viewed in a plan view. In FIG. 8B, the first and second sensing portions PP1 and PP2 may be disposed to be overlapped with the first and second sensor units SP1 and SP2, respectively. Similar to the first and second sensor units SP1 and SP2, the first sensing portion PP1 may be spaced from the second sensing portion PP2 by a specific (e.g., a set or predetermined) distance. For example, a distance from the first sensor unit SP1 to the second sensor unit SP2 may be substantially equal to a distance from the first sensing portion PP1 to the second sensing portion PP2. As shown in FIG. 8A, each of the first sensing electrodes TE1 to TE1-5 and the second sensing electrodes TE2-1 to TE2-4 may include a plurality of mesh lines MSH. Although not illustrated in FIG. 8B, the first and second sensing portions PP1 and PP2 may include a plurality of mesh lines MSH.

Figure 9A:
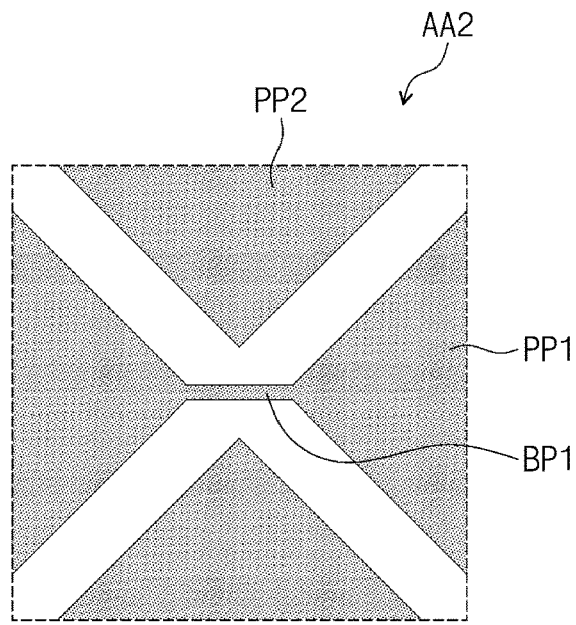
FIG. 9A is an enlarged plan view of the region AA2 of FIG. 7C, according to some embodiments of the present disclosure.
Figure 9B:
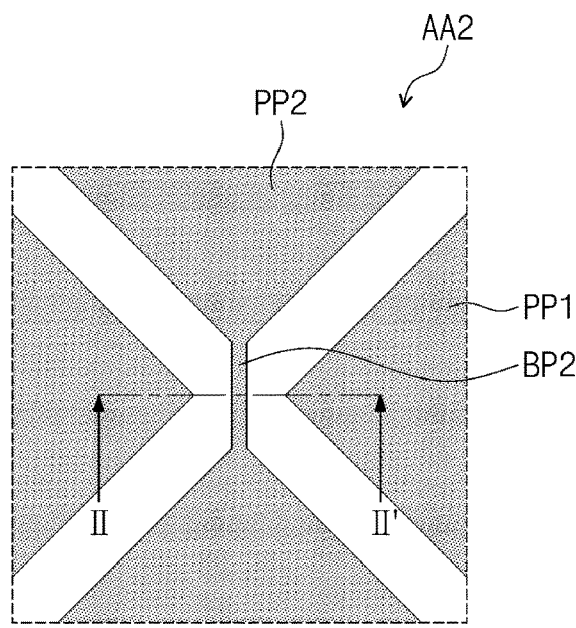
FIG. 9B is an enlarged plan view of the region AA2 of FIG. 7C, according to some embodiments of the present disclosure.
Figure 9C:
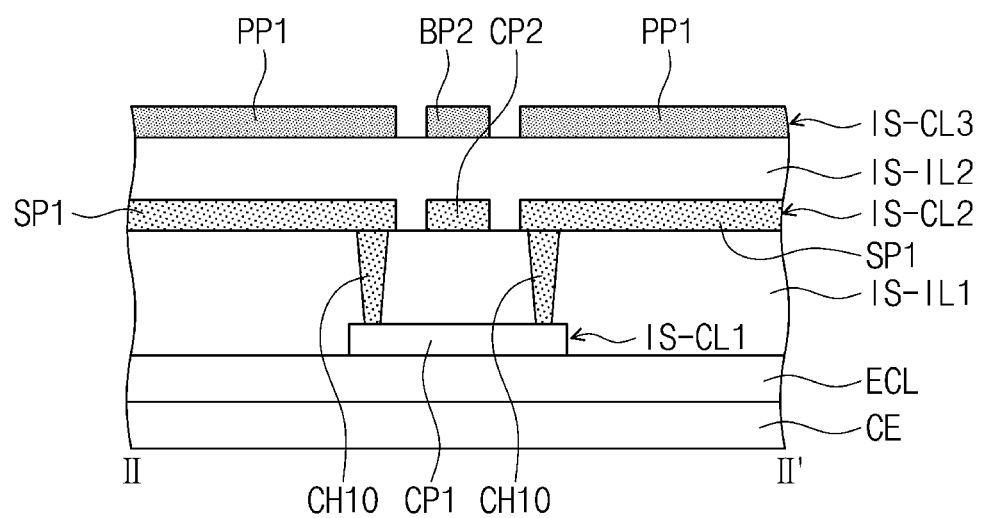
FIG. 9C is a sectional view taken along a line II-II' of FIG. 9B, according to some embodiments of the present disclosure.

FIG. 9A is an enlarged plan view of the region AA2 of FIG. 7C, according to some embodiments of the present disclosure. FIG. 9B is an enlarged plan view of the region AA2 of FIG. 7C, according to some embodiments of the present disclosure. In some embodiments, the input sensor IS may include bridges connecting sensing portions PP1 and PP2, which are disposed adjacent to either of the first conductive patterns PE1-1 to PE1-5 or the second conductive patterns PE2-1 to PE2-4. Referring to FIG. 9A, the first conductive patterns PE1-1 to PE1-5 may include first bridges BP1, each of which is provided to connect a corresponding pair of the first sensing portions PP1. Referring to FIG. 9B, the second conductive patterns PE2-1 to PE2-4 may include second bridges BP2, each of which is provided to connect a corresponding pair of, the second sensing portions PP2. FIG. 9C is a sectional view taken along a line II-II' of FIG. 9B. Referring to FIG. 9C, the first conductive patterns PE1-1 to PE1-5 may be overlapped with the first sensing electrodes TE1-1 to TE1-5. The first conductive patterns PE1-1 to PE1-5 may be spaced from each other at a region, in which the first sensing electrodes TE1-1 to TE1-5 are spaced from each other. In some embodiments, the second bridge BP2 disposed between the first conductive patterns PE1-1 to PE1-5 may be overlapped (e.g., in the third direction DR3) with the second connecting portion CP2 disposed between the first sensing electrodes TE1-1 to TE1-5.

Figure 10A:
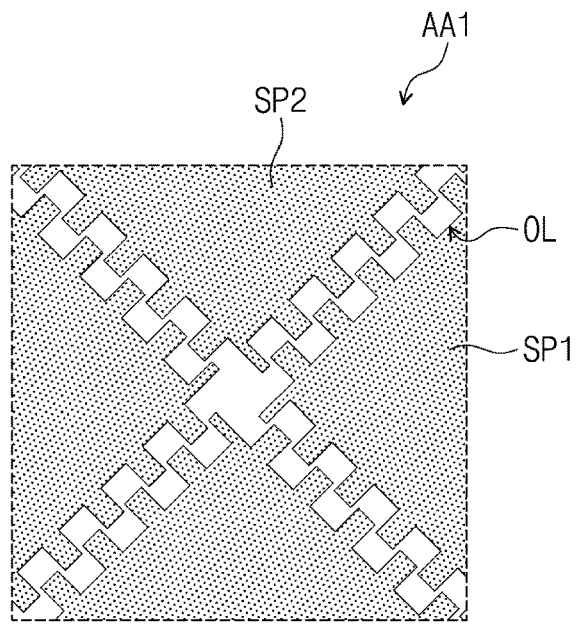
FIG. 10A is an enlarged plan view of the region AA1 of FIG. 7B, according to some embodiments of the present disclosure.
Figure 10B:
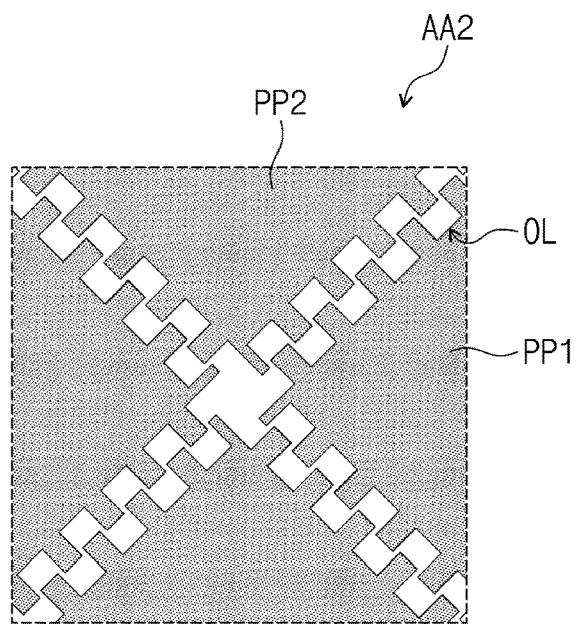
FIG. 10B is an enlarged plan view of the region AA2 of FIG. 7C, according to some embodiments of the present disclosure.

FIG. 10A is an enlarged plan view of the region AA1 of FIG. 7B, according to some embodiments of the present disclosure. FIG. 10B is an enlarged plan view of the region AA2 of FIG. 7C, according to some embodiments of the present disclosure. Referring to FIG. 10A, each of the first and second sensor units SP1 and SP2 may have an outer pattern OL having a zigzag shape. Referring to FIG. 10B, each of the first and second sensing portions PP1 and PP2 may have an outer pattern OL, which has the same shape as the outer pattern OL of the first and second sensor units SP1 and SP2. In the case where the outer patterns OL of the first and second sensor units SP1 and SP2 have the zigzag shape, the outer patterns OL of the first and second sensing portions PP1 and PP2 may also have the same shape (i.e., the zigzag shape). The outer patterns OL of the first and second sensing portions PP1 and PP2 may be respectively overlapped with the outer patterns OL of the first and second sensor units SP1 and SP2.

Figure 11A:
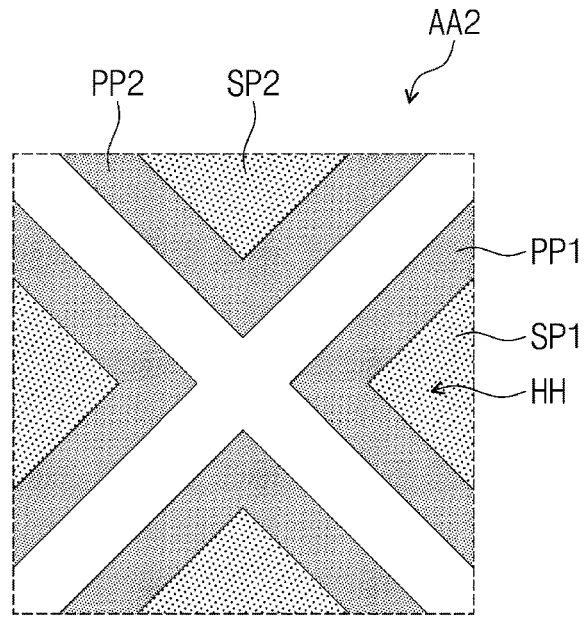
FIGS. 11A-11C are enlarged plan views, each of which illustrates the region AA2 of FIG. 7C according to some embodiments of the present disclosure.
Figure 11B:
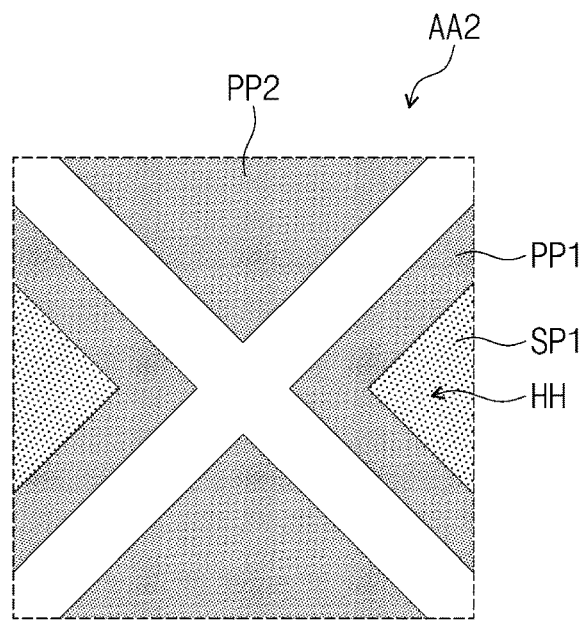
Figure 11C:
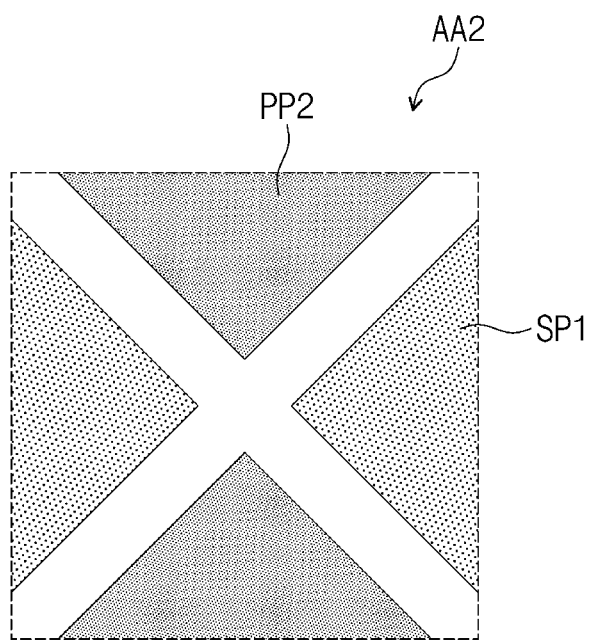

FIGS. 11A-11C are enlarged plan views, each of which illustrates the region AA2 of FIG. 7C according to some embodiments of the present disclosure.

The first and second sensing portions PP1 and PP2 may have hole regions HH provided therein. As an example, the hole regions HH may be provided in the second sensing portions PP2. In some embodiments, the hole regions HH may be provided in the first sensing portions PP1, the second sensing portions PP2, or in the first and second sensing portions PP1 and PP2. In the case where the hole regions HH are provided in the first sensing portions PP1 and/or the second sensing portions PP2, it may be possible to effectively reduce a noise issue between sensors (e.g., first and second sensor units SP1 and SP2). For example, in the case where it is more important to reduce the noise than to improve the touch sensitivity, the hole regions HH may be provided in at least one of the first and second sensing portions PP1 and PP2.

In some embodiments, the input sensor IS may include a conductive pattern, which is disposed on the first and second sensing electrodes TE1 and TE2 and is overlapped with either of the first and second sensing electrodes TE1 and TE2. The conductive pattern may be disposed on the insulating layer IL. In some embodiments, to suppress the noise issue, the input sensor IS may include only either of the first and second conductive patterns PE1-1 to PE1-5 and PE2-1 to PE2-4. For example, the input sensor IS may include only the first conductive patterns PE1-1 to PE1-5.

According to some embodiments of the present disclosure, a first conductive pattern and a second conductive pattern may be disposed on a first sensing electrode and a second sensing electrode, which are directly disposed on a display panel, and thus, it may be possible to increase conductivity of the sensing electrodes and thereby to improve touch sensitivity of an input sensor.

The first and second conductive patterns may be provided to have the same pattern shapes as the first and second sensing electrodes. This make it possible to prevent a noise issue from occurring in the input sensor and to improve the touch sensitivity of the input sensor. In other words, noise may be suppressed or reduced by making the pattern shapes of the first and second conductive patterns to be the same as those of the first and second sensing electrodes.

While example embodiments of the present disclosure have been particularly shown and described, it will be understood by one of ordinary skill in the art that variations in form and detail may be made therein without departing from the spirit and scope of the attached claims and equivalents thereof.

What is claimed is:
1. A display device, comprising:
 a display panel having a base surface; and
 an input sensor on the base surface,
 wherein the input sensor comprises:
  a first sensing electrode and a second sensing electrode, which are respectively extended in a first direction and a second direction crossing each other;
  an insulating layer covering the first and second sensing electrodes; and
  a first conductive pattern and a second conductive pattern, which are located on the insulating layer, are respectively overlapped with the first and second sensing electrodes, and are spaced from each other,
 wherein the first sensing electrode comprises a plurality of first sensor units arranged along the first direction, and first connecting portions that connect adjacent ones of the first sensor units,
 wherein the second sensing electrode comprises a plurality of second sensor units arranged along the second direction, and second connecting portions that connect adjacent ones of the second sensor units,
 wherein the insulating layer comprises a first insulating layer and a second insulating layer,
 wherein a group of connecting portions selected from the first connecting portions and the second connecting portions is on the base surface,
 wherein the first insulating layer is on the selected group of the connecting portions,
 wherein the first sensor units, the second sensor units, and another group of connecting portions, which are not selected from the first connecting portions and the second connecting portions, are on the first insulating layer,
 wherein the second insulating layer is on the first sensor units, the second sensor units, and the another group of the connecting portions,
 wherein the first and second conductive patterns are directly on the second insulating layer, and
 wherein the second conductive pattern corresponds to a floating electrode and comprises:
  a plurality of second floating portions overlapped with the second sensor units, respectively; and a plurality of bridges connecting adjacent ones of the second floating portions.

2. The display device of claim 1, wherein the first conductive pattern corresponds to a pattern of the first sensing electrode, and the second conductive pattern corresponds to a pattern of the second sensing electrode.

3. The display device of claim 1, wherein each of the first and second sensing electrodes comprises a plurality of mesh lines.

4. The display device of claim 3, wherein each of the first and second conductive patterns comprises a plurality of mesh lines.

5. The display device of claim 1, wherein an area of the first conductive pattern is substantially equal to an area of the first sensing electrode, and
wherein an area of the second conductive pattern is substantially equal to an area of the second sensing electrode.

6. The display device of claim 1, wherein the first and second conductive patterns have a thickness ranging from 30 Å to 200 Å.

7. The display device of claim 1, wherein the first conductive pattern corresponds to a floating electrode.

8. The display device of claim 1, wherein the input sensor further comprises a sensing region, in which the first and second sensing electrodes are located, and an interconnection region located outside the sensing region, and
wherein the first and second conductive patterns are located outside the interconnection region.

9. The display device of claim 1, wherein the first conductive pattern comprises a plurality of first floating portions overlapped with the first sensor units, respectively.

10. The display device of claim 9, wherein each of the first and second sensor units comprises an outer pattern having a zigzag shape, and
wherein each of the first and second floating portions comprises an outer pattern that is substantially the same as the outer pattern of a corresponding one of the first and second sensor units.

11. The display device of claim 9, wherein each of the first and second sensor units comprises four first outer sides, all of which have a same length, and
wherein each of the first and second floating portions comprises four second outer sides, which have the same length as that of the first outer sides.

12. The display device of claim 11, wherein the length of the second outer side ranges from 3 mm to 4 mm.

13. The display device of claim 9, wherein each of the first and second floating portions has a hole region therein.

14. The display device of claim 9, wherein each of the second floating portions has a hole region therein.

15. A display device, comprising:
a display panel having a base surface; and
an input sensor on the base surface,
wherein the input sensor comprises:
a first sensing electrode and a second sensing electrode, which are respectively extended in a first direction and a second direction crossing each other, the second sensing electrode being longer than the first sensing electrode;
a conductive pattern on the first and second sensing electrodes and overlapped with either of the first and second sensing electrodes; and
an insulating layer between the first and second sensing electrodes and the conductive pattern,
wherein the conductive pattern has substantially the same pattern shape and the same area as the first sensing electrode and the second sensing electrode,
wherein the conductive pattern comprises a plurality of floating portions arranged along at least one of the first and second directions,
wherein each of the floating portions comprises an outer side having a zigzag shape, and
wherein at least one of the first and second sensing electrodes comprises a sensing portion overlapping with the floating portions and comprising an outer side having a same zigzag shape as that of the outer side of the floating portions, protrusions of the zigzag shape of the floating portions entirely overlapping in a plan view, and being offset from in a third direction crossing the first and second directions, those of the at least one of the first and second sensing electrodes.

16. The display device of claim 15, wherein the conductive pattern comprises a first conductive pattern and a second conductive pattern, and
wherein the first conductive pattern has substantially the same pattern shape as the first sensing electrode, and the second conductive pattern has substantially the same pattern shape as the second sensing electrode.

* * * * *